United States Patent [19]
Miyamoto et al.

[11] Patent Number: 5,491,101
[45] Date of Patent: Feb. 13, 1996

[54] MANUFACTURING METHOD OF NON-VOLATILE SEMICONDUCTOR MEMORY DEVICES

[75] Inventors: Kyoko Miyamoto, Kyoto; Fumihiko Noro, Osaka, both of Japan

[73] Assignee: Matsushita Electronics Company, Osaka, Japan

[21] Appl. No.: 348,100

[22] Filed: Nov. 25, 1994

[30] Foreign Application Priority Data

Nov. 25, 1993 [JP] Japan .................................. 5-295152

[51] Int. Cl.$^6$ .............................................. H01L 21/8247
[52] U.S. Cl. .............................. 437/43; 437/44; 437/149; 437/158
[58] Field of Search ................................ 437/43, 44, 149, 437/150, 158

[56] References Cited

U.S. PATENT DOCUMENTS

| | | | |
|---|---|---|---|
| 4,514,897 | 5/1985 | Chiu et al. | 437/44 |
| 5,147,811 | 9/1992 | Sakagami | 437/43 |
| 5,264,384 | 11/1993 | Kaya et al. | 437/43 |

*Primary Examiner*—Chandra Chaudhari
*Attorney, Agent, or Firm*—Willian Brinks Hofer Gilson & Lione

[57] ABSTRACT

The invention provides a process to form on a certain conductive type semiconductor substrate 1 insulation layer 9 having openings 11, which regions will become source and drain; a process to form diffusion layer 8 of the same conductive type as semiconductor substrate 1 in to-be-drain space, with insulation layer 9 and photoresist 10 as masks; a process to form side wall layer 13 alongside openings of insulation layer 9; a process to form diffusion layers 4 and 5, conductive type of which layers is opposite to that of semiconductor substrate 1, in to-be-source and to-be-drain regions, with insulation layer 9 and side wall layer 13 as masks; a process to remove insulation layer 9 and side wall layer 13; and a process to form insulation layer 2 on semiconductor substrate in channel region distinguished by, and including part of, diffusion layers 4 and 5, and to form floating-gate electrode 3 on insulation layer 2, and control-gate electrode 7 with insulation layer 6 in between. The manufacturing method according to this invention forms drain and high density P-type diffusion layer by making use of side wall layer. Therefore, this makes it possible to shape DSA structure controlling the distance from drain to high density P-type diffusion layer with high accuracy, without using high temperature diffusion process. This means that this invention offers an easy way to make DSA structure with finer design rules.

3 Claims, 6 Drawing Sheets

5,491,101

MANUFACTURING METHOD OF NON-VOLATILE SEMICONDUCTOR MEMORY DEVICES

FIELD OF THE INVENTION

This invention relates to manufacturing method of electrically programable/erasable floating-gate semiconductor memory devices.

BACKGROUND OF THE INVENTION

One of the well-known electrically programable/erasable non-volatile memory devices is non-volatile memory transistor made of stacked-gate field-effect transistor, wherein programing is conducted by means of hot electron mechanism, and erasing by Fowler-Nordheim tunneling mechanism. In the stacked-gate non-volatile memory transistor, hot electron generated in diffusion layer is implanted in floating-gate electrode to change electric charge of floating-gate electrode. Thus, threshold voltage of transistor is changed, and information recorded. Typical construction of above mentioned stacked-gate non-volatile memory transistors is as shown in FIG. 6 by its cross-sectional view. Referring to FIG. 6, thin silicon oxide layer 2, which is tunneling medium, is formed on P-type silicon substrate 1. On silicon oxide layer 2 is floating-gate electrode 3. In silicon substrate, there are N-type diffusion layers, viz., source 4 and drain 5. On top-of floating-gate electrode 3, control-gate electrode is formed with silicon oxide layer 6 in between.

Recently, however, in order to increase programing speed of stacked-gate non-volatile memory transistor a new memory cell having DSA (Diffusion Self Align) structure as shown in FIG. 7 is proposed. In DSA structure, P-type (being the same conductive type as substrate) impurity layer is formed by means of ion-implantation to drain in self-aligning manner; in this way the impurity density of substrate at drain edge is enhanced to help easier occurrence of electric field concentration, thus the efficiency of hot electron generating is increased. Referring to FIG. 7, 1 indicates P-type silicon substrate, 4 source, 5 N-type diffusion layer, or drain region, 8 high density P-type diffusion layer that has been formed to the drain in self-aligning manner, 2 thin silicon oxide layer, or tunneling medium, 3 floating-gate electrode, 6 silicon oxide layer, or insulation layer, and 7 control-gate electrode. FIGS. 8(a)–8(f) shows prior art manufacturing method of DSA structure as shown in FIG. 7. First, as shown in FIG. 8(a), form silicon oxide layer 9 on P-type semiconductor substrate 1 providing openings for regions of source 4 and drain. 5, and then apply photoresist mask 10 to cover source region 4. Next, as-shown in FIG. 8(b), Boron ion-implantation using silicon oxide layer 9 and photoresist mask 10 as masks, to form high density P-type diffusion layer 8 in drain region 5. Then, as shown in FIG. 8(c), remove photoresist mask 10. After that, as shown in FIG. 8(d), high temperature (1000° C. ~1100° C.) heat treatment to expand region of high density P-type diffusion layer 8 to reach underneath silicon oxide layer 9. Then, as FIG. 8(e) shows, ion-implantation of Arsenic or Phosphorus with silicon oxide layer 9 as masks, to form high density N-type diffusion layers, or source 4 and drain 5. After these, as shown in FIG. 8(f), after removing silicon oxide layer 9, form silicon oxide layer 2 as tunneling medium, floating-gate electrode 3, silicon oxide layer 6, and control-gate electrode 7; DSA structure is thus formed.

Along with the needs for higher integration density in the field of non-volatile memory devices the channel length under floating-gate electrode 3 is requested to be made shorter. Under such situation, prior art manufacturing method of DSA structure which employs diffusion process accompanying high temperature heat treatment faces a difficulty in controlling diffusion depth of high density P-type diffusion layer 8; this makes manufacturing of finer pattern devices very difficult.

This invention is intended to solve above mentioned difficulty, and offers a new manufacturing method for floating-gate semiconductor memory devices having DSA structure; wherein high temperature diffusion process is eliminated, making it easier to manufacture finer pattern devices.

SUMMARY OF THE INVENTION

In order to accomplish above mentioned objective, this invention features in that it includes:

a process to form on semiconductor substrate of a certain conductive type the first insulation layer having openings corresponding to regions, which will become source and drain;

a process to form in a specified space of said to-be-drain region the first diffusion layer having the same conductive type as said semiconductor substrate, with said first insulation layer and photoresist as masks;

a process to form side wall layer alongside openings of said first insulation layer;

a process to form second and third diffusion layers of opposite conductive type in said to-be-source and to-be-drain regions of said semiconductor substrate, with said first insulation layer and said side wall layer as masks;

a process to remove said insulation layer and said side wall layer;

a process to form second insulation layer on said semiconductor substrate in a channel region distinguished by, and including part of, said second and third diffusion layers;

a process to form floating-gate electrode on said second insulation layer; and a process to form control-gate electrode on said floating-gate electrode with third insulation layer in between.

In the manufacturing method according to this invention, second and third diffusion layers can be formed in self-aligning manner by making use of side wall layer formed alongside opening of first insulation layer used to form first diffusion layer; and high temperature diffusion processing turns out to be unnecessary. This enables accurate control of diffusion length of first diffusion layer from edge of second diffusion layer. Further, it goes well with the low temperature processing which is essential to finer-pattern devices. In this way, this invention makes it significantly easier to design DSA structure of floating-gate semiconductor memory devices with finer design rules.

DESCRIPTION OF THE PREFERRED EMBODIMENTS

EMBODIMENT 1

Figure 1A:
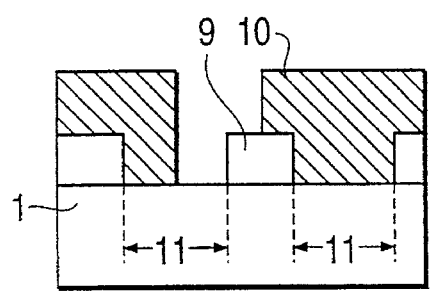
FIGS. 1(a)–1(h) shows cross-sectional structure in the sequence of process flow of semiconductor memory device of Embodiment 1 according to this invention.
Figure 1B:
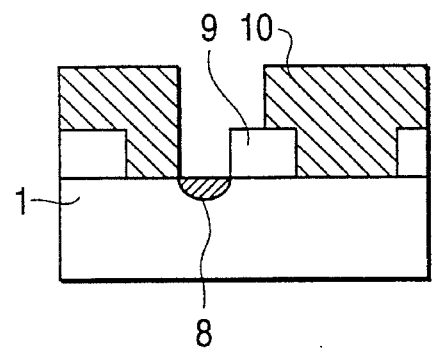
Figure 1C:
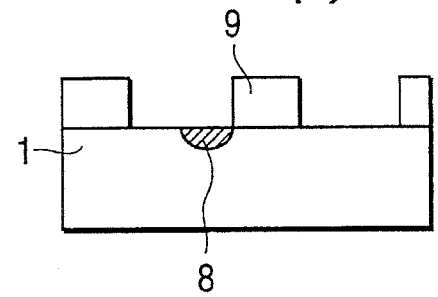
Figure 1D:
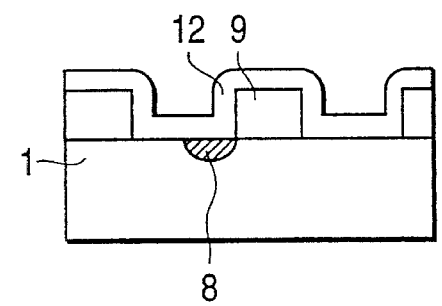
Figure 1E:
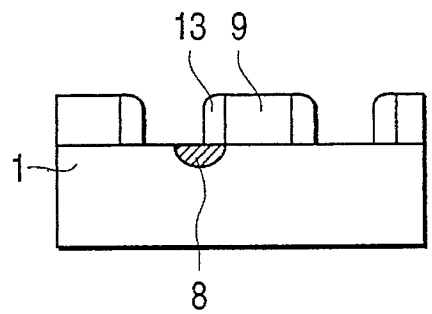
Figure 1F:
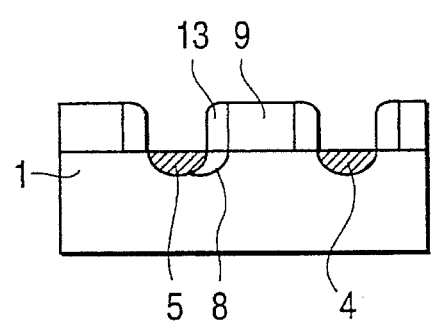
Figure 1G:
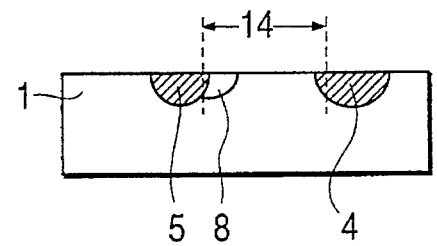
Figure 1H:
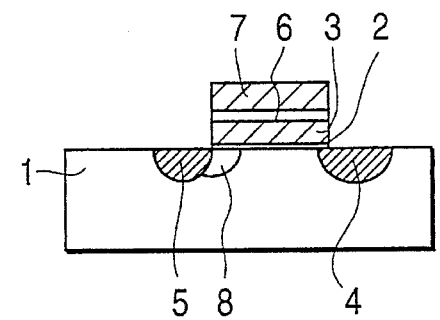
Figure 2:
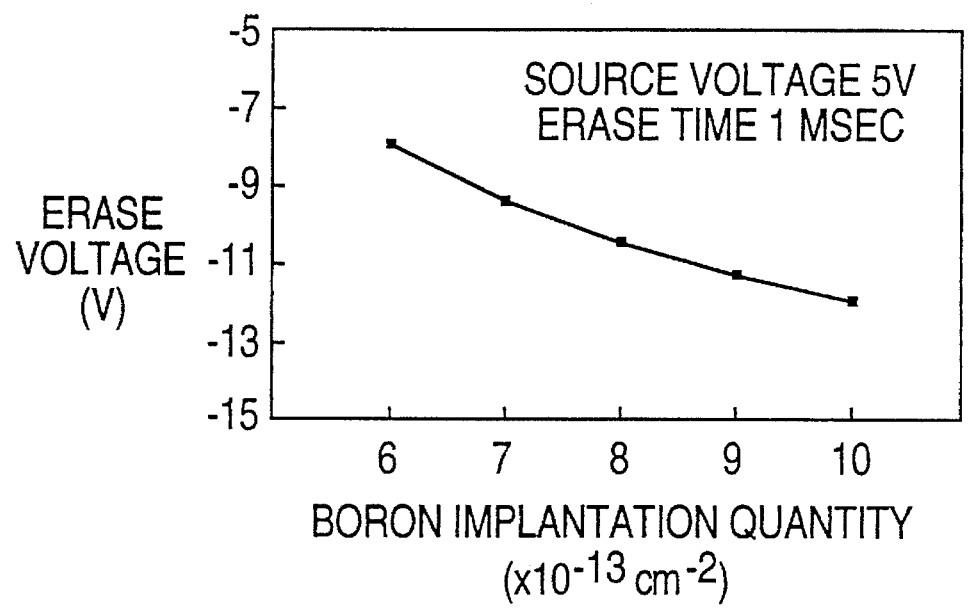
FIG. 2 shows corelationship between DSA Boron implantation quantity and erase voltage in Embodiment 1 according to this invention.
Figure 3:
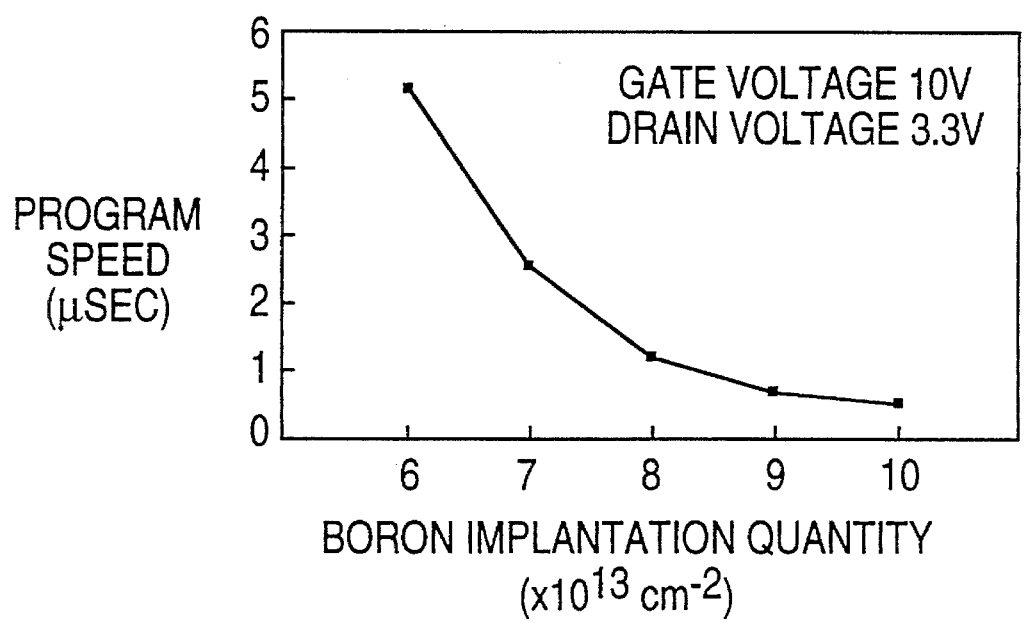
FIG. 3 shows corelationship between DSA Boron implantation quantity and program speed in Embodiment 1 according to this invention.

Referring to FIGS. 1(a)–1(h), FIG. 2 and FIG. 3, Embodiment 1 of this invention is herewith explained. FIG. 1 shows cross-sectional views of Embodiment 1 given in the sequence of process flow. To start with, CVD silicon oxide layer 9 of 400 nm thick is formed on P-type silicon substrate 1, as shown in FIG. 1(a). Then, by means of known photo etching technology make openings 11 of 300 nm width corresponding to regions that will become source 4 and drain 5. Then, cover to-be-source region 4 with photoresist mask 10. Then, as shown in FIG. i(b), form high density P-type diffusion layer 8 by means of Boron ion implantation with CVD silicon oxide layer 9 and photoresist mask 10 as masks. Processing conditions of Boron ion implantation to form high density P-type diffusion layer 8 need to be optimized in relation to program speed and erase voltage of semiconductor memory device having DSA structure as shown in this Embodiment. FIG. 2 shows corelationship between Boron implantation quantity (acceleration voltage 50 KeV) and erase voltage. Where, erasing is done by applying negative voltage to gate, and positive voltage to source. Erase time was set at 1 msec., source voltage 5 V. From FIG. 2 one will see that when Boron implantation quantity is about $8 \times 10^{13}$ cm$^{-2}$ erasing can be done at $-12$ V gate voltage. FIG. 3 shows corelationship between Boron implantation quantity and program speed. Where, programming is done by applying 10 V to gate, 3.3 V to drain. From FIG. 3 one will see that when Boron implantation quantity is over $8 \times 10^{13}$ cm$^{-2}$ program speed is less than 1.0 μsec. In this Embodiment 1, conditions of Boron ion implantation are set at 50 KeV, $8 \times 10^{13}$ cm$^{-2}$ to make the ultimate diffusion depth 0.25 μm. Then, as FIG. 1(c) shows, remove photoresist mask 10. After this, as FIG. 1(d) shows, grow 10 nm thick CVD silicon oxide layer 12. Then, as FIG. 1(e) shows, form side wall layer 13 by means of known anisotropic oxide layer etching. Then, as FIG. 1(f) shows, form N-type diffusion layers, source 4 and drain 5, by implanting Arsenic ion (40 KeV, $4 \times 10^{15}$ cm$^{-2}$) using CVD silicon oxide layer 9 and side wall layer 13 as masks. After this, apply heat treatment in 900° C. Nitrogen atmosphere to drive-in source 4 and drain 5, as shown in FIG. 1(g). After removing CVD silicon oxide layer 9 and side wall layer 13, grow 10 nm thick silicon oxide layer 2 as tunneling medium in oxidizing atmosphere on channel region 14 which is distinguished by, and including part of, N-type diffusion layers, or source 4 and drain 5, as shown in FIG. 1(h). And then, form floating-gate electrode 3 of polysilicon layer on silicon oxide layer 2. Next, on floating-gate electrode 3, grow 25 nm thick silicon oxide insulation layer 6, and on silicon oxide layer form control-gate electrode 7 of polysilicon layer; thus, as shown in FIG. 1(h), DSA structure is constructed.

As explained above, in this Embodiment, the high density P-type diffusion layer 8 is formed in self-aligning manner by the benefit of side wall layer 13 formed alongside the opening of silicon oxide layer 9.

This means that DSA structure can be accomplished with the low temperature processing, making the high temperature diffusion processing unnecessary; furthermore, diffusion length of high density P-type diffusion layer 8 from edge of drain 5 can be controlled with high accuracy, which makes it easier to design DSA structure with finer design rules.

EMBODIMENT 2

FIGS. 4(a)–4(h) shows cross-sectional views of Embodiment 2 of this invention given in the sequence of process flow.

Figure 4A:
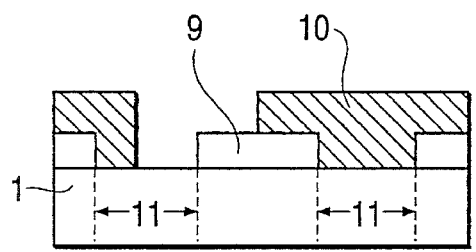
FIGS. 4(a)–4(h) shows cross-sectional structure in the sequence of process flow of semiconductor memory device of Embodiment 2 according to this invention.
Figure 4E:
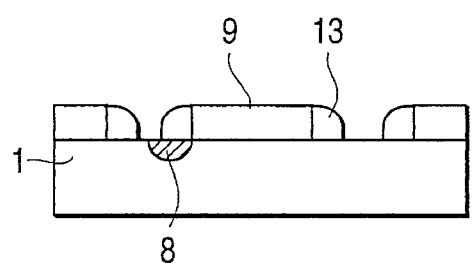
Figure 4B:
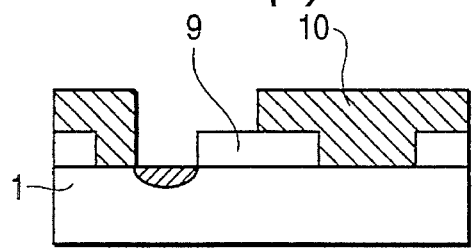
Figure 4F:
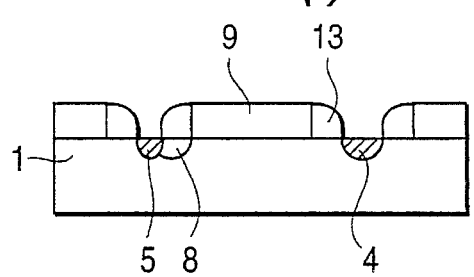
Figure 4C:
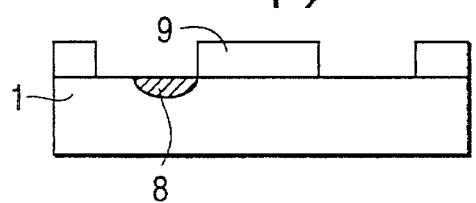
Figure 4G:
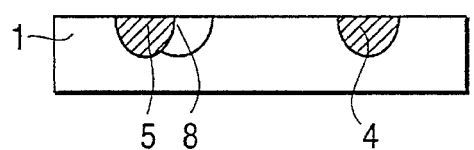
Figure 4D:
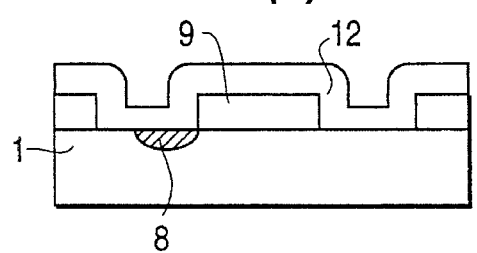
Figure 4H:
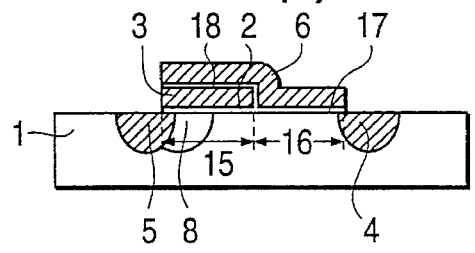

As shown in FIG. 4(a), form 400 nm thick CVD silicon oxide layer 9, having openings of 900 nm width for regions to-be-source 4 and to-be-drain 5, on P-type silicon substrate 1, by using known photo etching technology; and photoresist mask 10 to cover to-be-source 4 region. As shown in FIG. 4(b), form high density P-type diffusion layer 8 by means of Boron ion implantation (50 KeV, $1 \times 10^{14}$ cm$^{-2}$) with CVD silicon oxide layer 9 and photoresist mask 10 as masks. Then, as shown in FIG. 4(c), remove photoresist mask 10. After that, as shown in FIG. 4(d), grow CVD silicon oxide layer of 300 nm thick. And, as shown in FIG. 4(e), form side wall layer 13 by means of known anisotropic oxide layer etching process. Then, as shown in FIG. 4(f), form N-type diffusion layers, or source 4 and drain 5, by means of Arsenic ion implantation (40 KeV, $4 \times 10^{15}$ cm$^{-2}$) with CVD silicon oxide layer 9 and side wall layer 13 as masks. Then, as shown in FIG. 4(g), apply heat treatment in 900° C. Nitrogen atmosphere to drive-in source 4 and drain 5; and remove CVD silicon oxide layer 9 and side wall layer 13. And then, as shown in FIG. 4(h), grow in oxidizing atmosphere 10 nm thick silicon oxide layer 2 as tunneling medium on the first sector 15 (locating in the side of drain 5) of channel region distinguished by, and including part of, N-type diffusion layers, or source 4 and drain 5. And, form floating-gate electrode 3 of polysilicon layer on silicon oxide layer 2. Next, grow 30 nm thick silicon oxide layer 17 as gate insulating layer on the second sector 16 (locating in the side of source 4) of channel region distinguished by N-type diffusion layers, or source 4 and drain 5; and 40 nm thick silicon oxide layer 18 as insulating layer on floating-gate electrode 3; and control-gate electrode 7 of polysilicon layer on silicon oxide layers 17 and 18. In this way, split-gate type DSA structure is shaped.

As explained above, this invention can be used to make DSA structure, not only in the stacked-gate non-volatile memory transistors, also in the split-gate non-volatile memory transistors. Because it can form high density P-type diffusion layer 8 in self-aligning manner by making use of side wall layer 13 formed alongside opening of silicon oxide layer 9, diffusion process which uses high temperature heat treatment turns out to be unnecessary; which means that DSA structure can be implemented with the lower temperature processing, and diffusion length of high density P-type diffusion layer 8 from edge of drain 5 can be controlled with higher accuracy. In this way, the invention makes it easier to implement DSA structure with finer design rules.

EMBODIMENT 3

FIGS. 5(a)–5(g) shows cross-sectional views of Embodiment 3 of this invention given in the sequence of process flow.

Figure 5A:
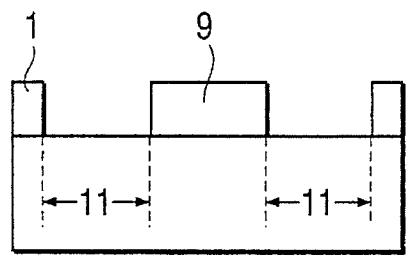
FIGS. 5(a)–5(g) shows cross-sectional structure in the sequence of process flow of semiconductor memory device of Embodiment 3 according to this invention.
Figure 5B:
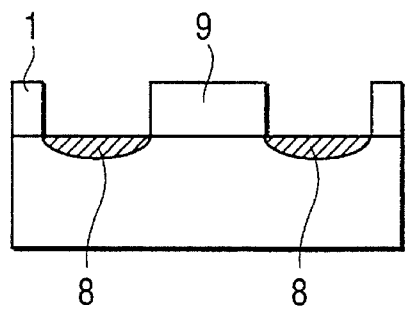
Figure 5C:
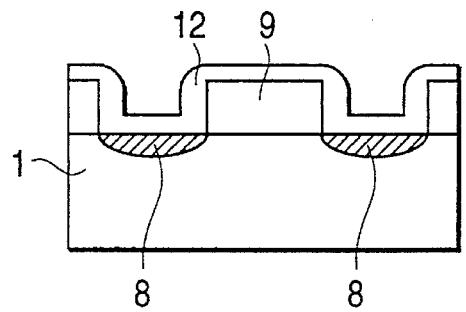
Figure 5D:
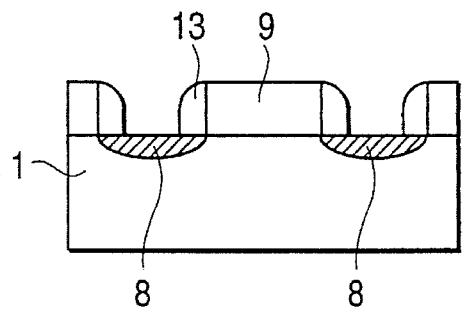
Figure 5E:
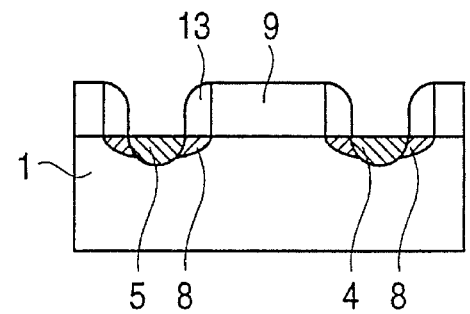
Figure 5F:
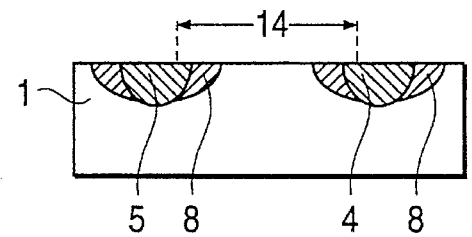
Figure 5G:
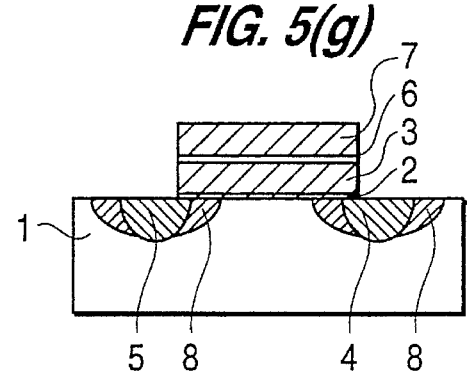
Figure 6:
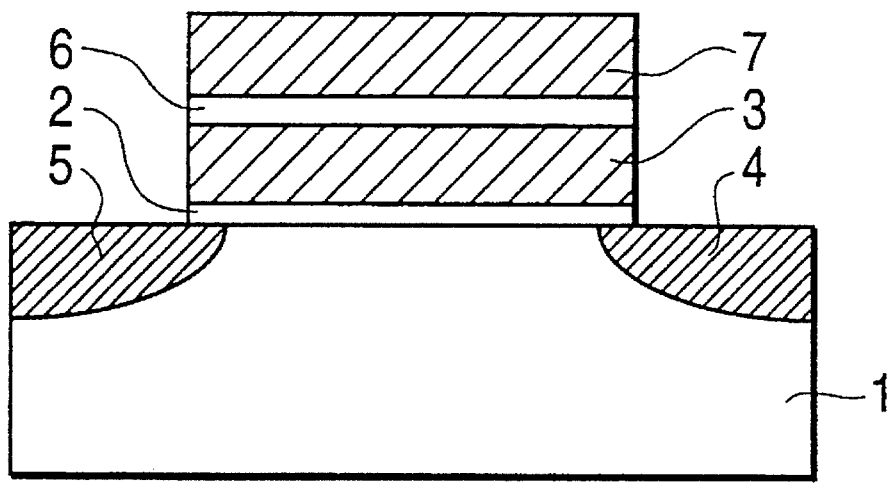
FIG. 6 shows cross-sectional structure of prior art stacked-gate non-volatile memory transistor.
Figure 7:
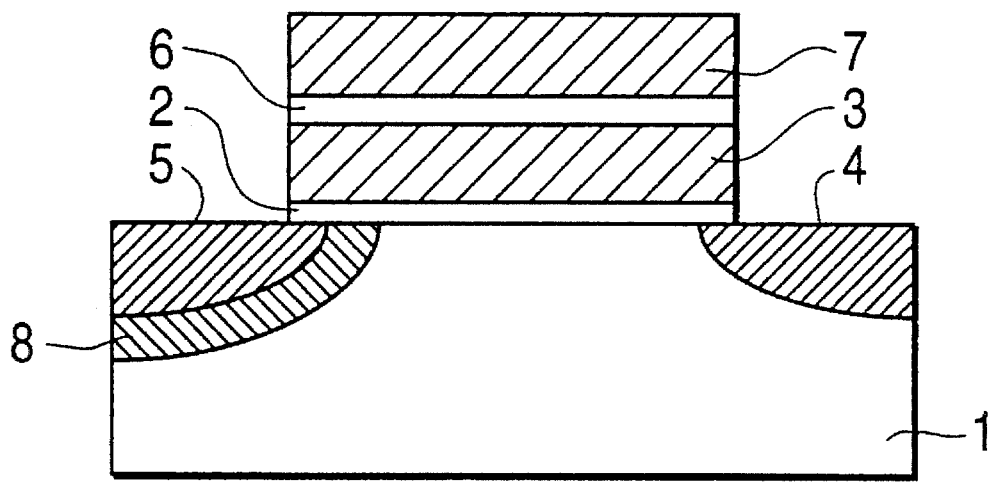
FIG. 7 shows cross-sectional structure of stacked-gate non-volatile memory transistor having DSA structure.
Figure 8A:
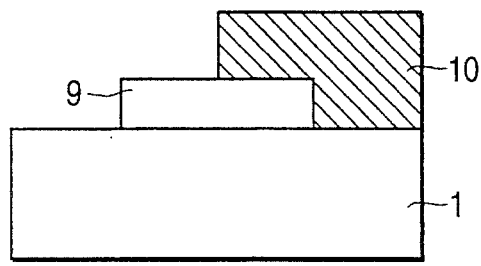
FIGS. 8(a)–8(f) shows cross-sectional structure in the sequence of process flow of semiconductor memory device having prior art DSA structure.
Figure 8B:
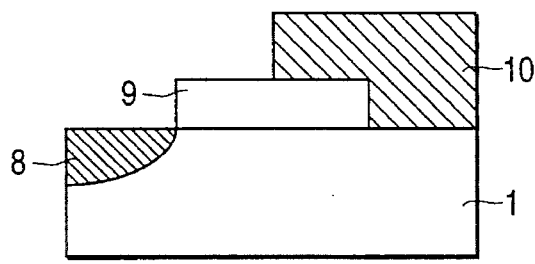
Figure 8C:
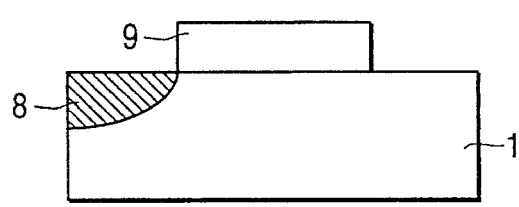
Figure 8D:
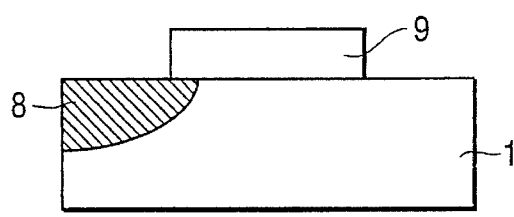
Figure 8E:
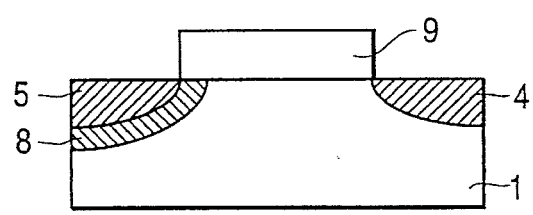
Figure 8F:
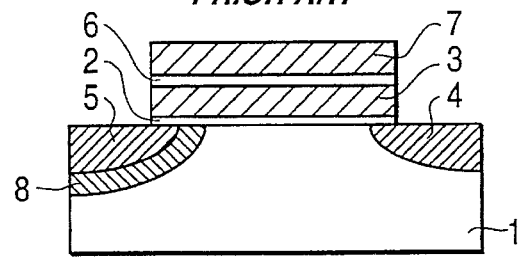

As shown in FIG. 5(a), form 400 nm thick CVD silicon oxide layer 9 on P-type silicon substrate 1. Then by means of photo etching technology make openings 11 of 300 nm width for the regions to become source 4 and drain 5. As shown in FIG. 5(b), form high density P-type diffusion layers 8 by means of Boron ion implantation (50 KeV, $8\times10^{13}$ cm$^{-2}$) with CVD silicon oxide layer 9 as mask. Then, as shown in FIG. 5(c), grow 100 nm thick CVD silicon oxide layer 12. And then, as shown in FIG. 5(d), form side wall layer 13 by means of known anisotropic oxide layer etching process. Then, as shown in FIG. 5(e), form N-type diffusion layers, or source 4 and drain 5, by means of Arsenic ion implantation (40 KeV, $4\times10^{15}$ cm$^{-2}$) with CVD silicon oxide layer 9 and side wall layer 13 as masks. After that, as shown in FIG. 5(f), apply heat treatment in 900° C. Nitrogen atmosphere to drive-in source 4 and drain 5. After removing CVD silicon oxide layer 9 and side wall layer 13, grow in the oxidizing atmosphere 10 nm thick silicon oxide layer 2 as tunneling medium on channel region 14 distinguished by, and including part of, N-type diffusion layers, or source 4 and drain 5, as shown in FIG. 5(g). Then, form floating-gate electrode 3 of polysilicon layer on silicon oxide layer 2, and grow 25 nm thick silicon oxide layer 6 as insulating layer on floating-gate electrode 3. Form control-gate electrode 7 of polysilicon layer on silicon oxide layer 6. In this way, DSA structure is accomplished as shown in FIG. 5.

As explained above, this invention makes it possible to implement DSA structure having high density P-type diffusion layer 8 at both source 4 and drain 5 sides, not only at drain 5 side alone. As in the case of this Embodiment, because high density P-type diffusion layer 8 is formed in self-aligning manner by forming side wall layer 13 alongside opening of silicon oxide layer 9 diffusion process that employs high temperature heat treatment turns out to be unnecessary. This means that DSA structure can be implemented with lower temperature processing, and that diffusion length of high density P-type diffusion layer from edge of drain 5 can be controlled with higher accuracy; making it easy to make DSA structure with finer design rules.

In the above mentioned Embodiments, such thin silicon oxide as tunneling medium was exampled for silicon oxide layer 2; however, one may of course use thick silicon oxide layer of around 30 nm thick.

We claim:

1. Manufacturing method of a non-volatile semiconductor memory device, featuring in that it comprises:
   a process to form on a semiconductor substrate of a conductive type a first insulation layer having two openings so that the semiconductor substrate is exposed and the first insulation layer having two edges in each opening;
   a process to mask one of said two openings and a portion of the other opening with photoresist;
   a process to form in said semiconductor substrate a first diffusion layer of the same conductive type as said semiconductor substrate, with said first insulation layer and said photoresist as masks;
   a process to remove said photoresist;
   a process to form a side wall layer alongside each edge of said first insulation layer in said two openings;
   a process to form in said semiconductor substrate second and third diffusion layers, having a conductive type opposite to that of said semiconductor substrate, through said two openings, with said first insulation layer and the side wall layers as masks;
   a process to remove said first insulation layer and the side wall layers;
   a process to form a second insulation layer on a channel region distinguished by, and including part of, said second and third diffusion layers on said semiconductor substrate;
   a process to form a floating-gate electrode on said second insulation layer;
   a process to form a third insulation layer on said floating-gate electrode; and
   a process to form a control-gate electrode on said third insulation layer.

2. Manufacturing method of a split-gate non-volatile semiconductor memory device, featuring in that it comprises:
   a process to form on a semiconductor substrate of a conductive type a first insulation layer having two openings so that the semiconductor substrate is exposed and the first insulation layer having two edges in each opening;
   a process to mask one of said two openings and a portion of the other opening with photoresist;
   a process to form in said semiconductor substrate a first diffusion layer of the same conductive type as said semiconductor substrate, with said first insulation layer and said photoresist as masks;
   a process to remove said photoresist;
   a process to form a side wall layer alongside each edge of said first insulation layer in said two openings;
   a process to form in said semiconductor substrate second and third diffusion layers, having a conductive type opposite to that of said semiconductor substrate, through said two openings, with said first insulation layer and the side wall layers as masks so that a channel region distinguished by, and including part of, said second and third diffusion layers is formed having a first portion spaced from the third diffusion layer and a remaining portion;
   a process to remove said first insulation layer and the side wall layers;
   a process to form a second insulation layer on the first portion of the channel region;
   a process to form a floating-gate electrode on said second insulation layer;
   a process to form a third insulation layer on said floating-gate electrode and on the remaining portion of the channel region; and
   a process to form a control-gate electrode on said third insulation layer.

3. Manufacturing method of a non-volatile semiconductor memory device featuring in that it comprises:
   a process to form on a semiconductor substrate of a conductive type a first insulation layer having two openings so that the semiconductor substrate is exposed and the first insulation layer having two edges in each opening;

a process to form in said semiconductor substrate first and second diffusion layers of the same conductive type as said semiconductor substrate through said two openings, with said first insulation layer as a mask;

a process to form a side wall layer alongside each edge of said first insulation layer in said two openings;

a process to form in said semiconductor substrate third and fourth diffusion layers, having a conductive type opposite to that of said semiconductor substrate, through said openings, with said first insulation layer and the side wall layer as masks;

a process to remove said first insulation layer and the side wall layers;

a process to form on said semiconductor substrate a second insulation layer on a channel region distinguished by, and including part of, said third and fourth diffusion layers;

a process to form a floating-gate electrode on said second insulation layer;

a process to form a third insulation layer on said floating-gate electrode; and a process to form a control-gate electrode on said third insulation layer.

* * * * *